(12) United States Patent
Shimamoto

(10) Patent No.: US 12,199,573 B2
(45) Date of Patent: Jan. 14, 2025

(54) POWER AMPLIFIER CIRCUIT

(71) Applicant: Murata Manufacturing Co., Ltd., Kyoto (JP)

(72) Inventor: Kenichi Shimamoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 620 days.

(21) Appl. No.: 16/923,493

(22) Filed: Jul. 8, 2020

(65) Prior Publication Data

US 2021/0013847 A1    Jan. 14, 2021

(30) Foreign Application Priority Data

Jul. 9, 2019  (JP) ................................. 2019-127825

(51) Int. Cl.
*H03F 1/52*   (2006.01)
*H03F 1/56*   (2006.01)
*H03F 3/21*   (2006.01)

(52) U.S. Cl.
CPC ............... *H03F 1/52* (2013.01); *H03F 1/56* (2013.01); *H03F 3/21* (2013.01); *H03F 2200/222* (2013.01); *H03F 2200/387* (2013.01); *H03F 2200/426* (2013.01); *H03F 2200/451* (2013.01); *H03F 2200/93* (2013.01)

(58) Field of Classification Search
CPC ..... H03F 1/52; H03F 1/56; H03F 3/21; H03F 2200/222; H03F 2200/387; H03F 2200/426; H03F 2200/451; H03F 2200/93; H03F 1/0261; H03F 3/245; H03F 2200/444; H03F 3/195; H03F 3/19; H03F 3/211; H03F 3/68; H03F 3/10; H03F 2200/441
USPC .................................................. 330/296, 298
See application file for complete search history.

(56) References Cited

U.S. PATENT DOCUMENTS

| 5,905,617 A * | 5/1999 | Kawasoe | H03F 1/52 |
| | | | 361/86 |
| 6,580,321 B1 | 6/2003 | Arell et al. | |
| 7,593,698 B1 * | 9/2009 | Johnson | H03F 1/0211 |
| | | | 375/300 |

FOREIGN PATENT DOCUMENTS

| CN | 107493083 A | 12/2017 |
| JP | 2018-142688 A | 9/2018 |
| KR | 10-0310797 B1 | 11/2001 |
| KR | 10-2008-0045244 A | 5/2008 |
| WO | 2007/035777 A2 | 3/2007 |

* cited by examiner

*Primary Examiner* — Andrea Lindgren Baltzell
*Assistant Examiner* — Khiem D Nguyen
(74) *Attorney, Agent, or Firm* — Pearne & Gordon LLP

(57) ABSTRACT

A power amplifier circuit includes a first amplifier that amplifies an input signal and outputs a first amplified signal, a second amplifier that is disposed subsequent to the first amplifier and that amplifies the first amplified signal and outputs a second amplified signal, and a clamp circuit that is disposed between ground and a signal line extending between the first amplifier and the second amplifier and that suppresses an amplitude of the first amplified signal.

13 Claims, 20 Drawing Sheets

POWER AMPLIFIER CIRCUIT

This application claims priority from Japanese Patent Application No. 2019-127825 filed on Jul. 9, 2019. The content of this application is incorporated herein by reference in its entirety.

BACKGROUND

The present disclosure relates to a power amplifier circuit. In communication using radio frequency (RF) signals by mobile devices, such as mobile phones, power amplifier circuits are used to amplify the RF signals. Japanese Unexamined Patent Application Publication No. 2018-142688 discloses a semiconductor device including a protection circuit to protect an amplifier of a power amplifier circuit against destruction when an excessive voltage exceeding a maximum allowable voltage is applied to the amplifier. The protection circuit can protect the power amplifier circuit when an excessive voltage is applied to the power amplifier circuit from the outside.

In a power amplifier circuit including a plurality of stages of transistors for amplification, a larger voltage is applied to and a larger amount of current flows through a subsequent amplifier than a preceding amplifier. One technique for preventing the subsequent amplifier from destruction in the power amplification process is to adjust a bias voltage for the amplifier using a control integrated circuit (IC) of the power amplifier circuit. However, the protection of the amplifier using the control IC may not be sufficient in terms of the speed of the response to an instantaneous excessive voltage. In addition, the control IC with a protection function increases the size of the circuit.

BRIEF SUMMARY

The present disclosure provides a power amplifier circuit in which destruction of an amplifier by an excessive voltage is suppressed.

According to embodiments of the present disclosure, a power amplifier circuit includes a first amplifier that amplifies an input signal and outputs a first amplified signal, a second amplifier that is disposed subsequent to the first amplifier and that amplifies the first amplified signal and outputs a second amplified signal, and a clamp circuit that is disposed between ground and a signal line extending between the first amplifier and the second amplifier and that suppresses an amplitude of the first amplified signal.

According to embodiments of the present disclosure, it is possible to provide a power amplifier circuit in which destruction of an amplifier by an excessive voltage is suppressed.

Other features, elements, characteristics and advantages of the present disclosure will become more apparent from the following detailed description of embodiments of the present disclosure with reference to the attached drawings.

DETAILED DESCRIPTION

The following describes an embodiment of the present disclosure in detail with reference to the drawings. The same or substantially the same elements are identified with the same numerals and will not be described repeatedly as much as possible.

Figure 1:
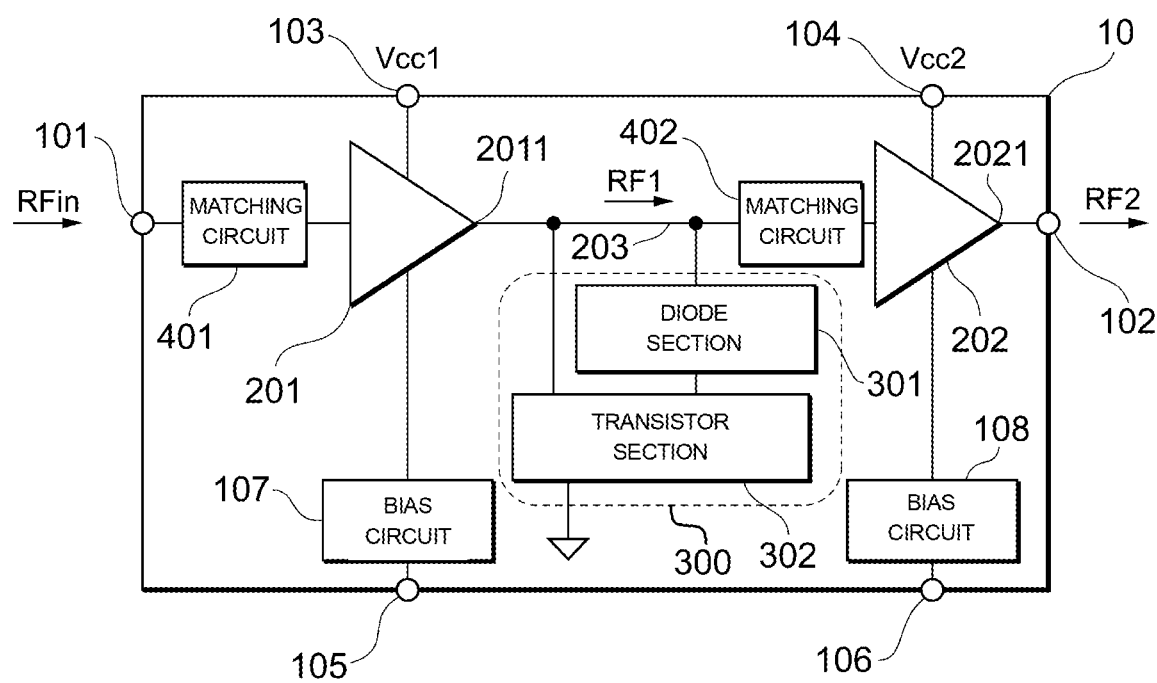
FIG. 1 is a block diagram of a power amplifier circuit according to an embodiment.

A power amplifier circuit 10 according to this embodiment will be described. FIG. 1 is a block diagram of the power amplifier circuit 10. The power amplifier circuit 10 includes terminals 101, 102, 103, 104, 105, and 106, bias circuits 107 and 108, amplifiers 201 and 202, a signal line 203, a clamp circuit 300, and matching circuits 401 and 402.

The terminal 101 is connected to the matching circuit 401. An input signal RFin is supplied to the terminal 101 from the outside. The terminal 102 is connected to an output terminal 2021 of the amplifier 202. An amplified signal RF2 is supplied from the terminal 102 to the outside.

The terminal 103 is connected to the amplifier 201. A power supply voltage Vcc1 is supplied to the amplifier 201 through the terminal 103. The terminal 104 is connected to the amplifier 202. A power supply voltage Vcc2 is supplied to the amplifier 202 through the terminal 104.

The terminal 105 is connected to the bias circuit 107. A control signal is supplied to the bias circuit 107 from an external control IC (not illustrated) through the terminal 105. The bias circuit 107 supplies a bias voltage or bias current to the amplifier 201 in accordance with the supplied control signal.

The terminal 106 is connected to the bias circuit 108. A control signal is supplied to the bias circuit 108 from the external control IC through the terminal 106. The bias circuit 108 supplies a bias voltage or bias current to the amplifier 202 in accordance with the supplied control signal.

The input side of the amplifier 201 is connected to the matching circuit 401. An output terminal 2011 of the amplifier 201 is connected to one end of the signal line 203. The signal line 203 is a line formed in the power amplifier circuit 10, for example. The amplifier 201 amplifies the input signal RFin supplied thereto via the matching circuit 401 and outputs an amplified signal RF1.

The amplifier 202 is disposed subsequent to the amplifier 201. The amplifier 202 is connected to the other end of the signal line 203. The amplifier 202 amplifies the amplified signal RF1 supplied thereto from the amplifier 201 along the signal line 203 and outputs the amplified signal RF2.

The clamp circuit 300 is disposed between the signal line 203 and ground. The clamp circuit 300 includes a diode section 301 and a transistor section 302.

The diode section 301 is disposed on a branch from the signal line 203. The transistor section 302 is disposed on a branch from the signal line 203 originating at a position different from the branch point for the diode section 301. The transistor section 302 is connected to ground. The diode section 301 is connected to ground via the transistor section 302. A specific configuration of the clamp circuit 300 will be described below.

The matching circuit 401 is connected between the terminal 101 and the amplifier 201. The matching circuit 401 performs impedance matching between the terminal 101 and the input of the amplifier 201.

The matching circuit 402 is connected between the amplifier 201 and the amplifier 202. The matching circuit 402 performs impedance matching between the output terminal 2011 of the amplifier 201 and the input of the amplifier 202.

In the power amplifier circuit 10, the input signal RFin is amplified by the amplifier 201, and the amplified signal RF1 output from the amplifier 201 is amplified by the amplifier 202. Accordingly, the input signal RFin is amplified appropriately.

Figure 2:
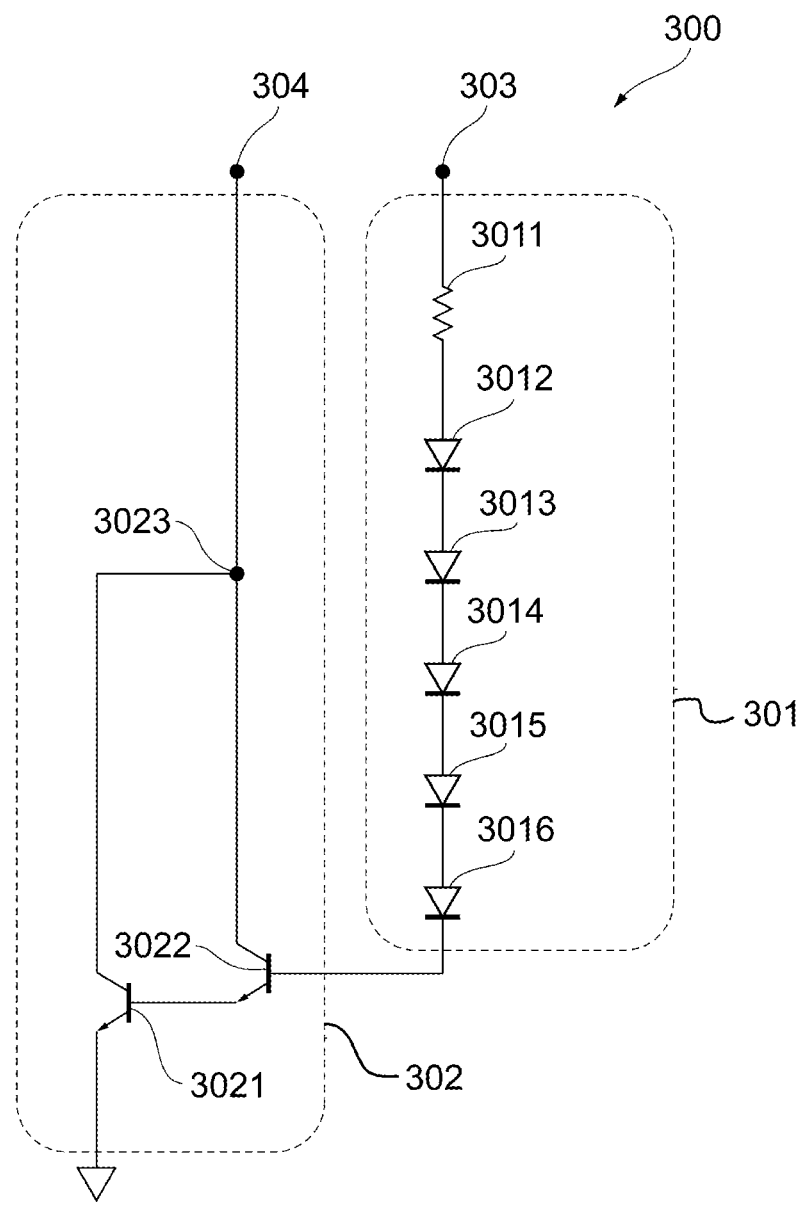
FIG. 2 is a circuit diagram of a clamp circuit according to the embodiment.

The clamp circuit 300 will be described with reference to FIG. 2. FIG. 2 is a circuit diagram of the diode section 301 and the transistor section 302.

The diode section 301 includes a resistance element 3011 and diodes 3012, 3013, 3014, 3015, and 3016. One end of the resistance element 3011 is connected to a node 303 connected to another circuit. The other end of the resistance element 3011 is connected to the anode of the diode 3012. The resistance element 3011 is disposed to adjust the amount of current flowing through the diode section 301.

The anodes of the diodes 3012, 3013, 3014, 3015, and 3016 are connected to the signal line 203 side, and the cathodes thereof are connected to the ground side. The diodes 3012, 3013, 3014, 3015, and 3016 are connected in series with each other. The cathode of the diode 3016 is connected to the transistor section 302.

The transistor section 302 includes a transistor 3021 and a transistor 3022. The collector of the transistor 3021 is connected to a branch point 3023 between a node 304 and the transistor 3022. The emitter of the transistor 3021 is connected to ground.

The collector of the transistor 3022 is connected to the node 304, which is connected to another circuit. The base of the transistor 3022 is connected to the cathode of the diode 3016. The emitter of the transistor 3022 is connected to the base of the transistor 3021. That is, the transistor 3022 is Darlington-connected to the transistor 3021.

The node 303 and the node 304 are connected in parallel to the signal line 203. Thus, the clamp circuit 300 is arranged in the power amplifier circuit 10.

Figure 3:
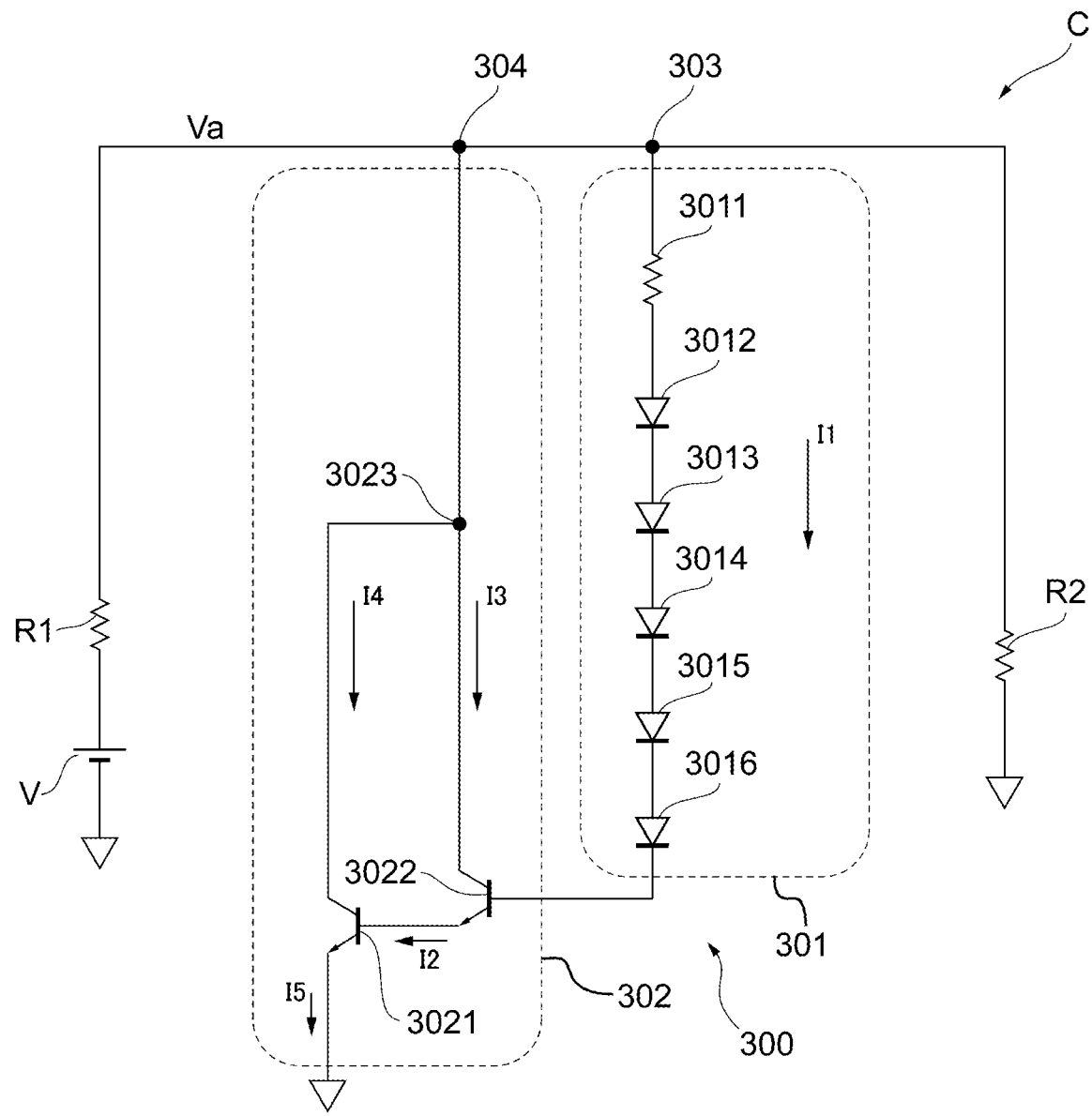
FIG. 3 is a circuit diagram describing the operation of the clamp circuit.

The operation of the clamp circuit 300 will be described. FIG. 3 illustrates a circuit C for performing a simulation of the operation of the clamp circuit 300. The circuit C includes a direct-current (DC) power supply V, a resistance element R1, the clamp circuit 300, and a resistance element R2.

The low-voltage side of the DC power supply V is connected to ground. The high-voltage side of the DC power supply V is connected to one end of the resistance element R1. The other end of the resistance element R1 is connected to one end of the resistance element R2. The other end of the resistance element R2 is connected to ground. The clamp circuit 300 is disposed at the node 303 and the node 304 between ground and a signal line extending between the resistance element R1 and the resistance element R2.

The operation of the clamp circuit 300 in the circuit C will be described with reference to FIGS. 4 to 9. FIGS. 4 to 9 illustrate results of the simulation of changing a DC voltage Vdc of the DC power supply V from 0 V to 10 V.

Figure 4:
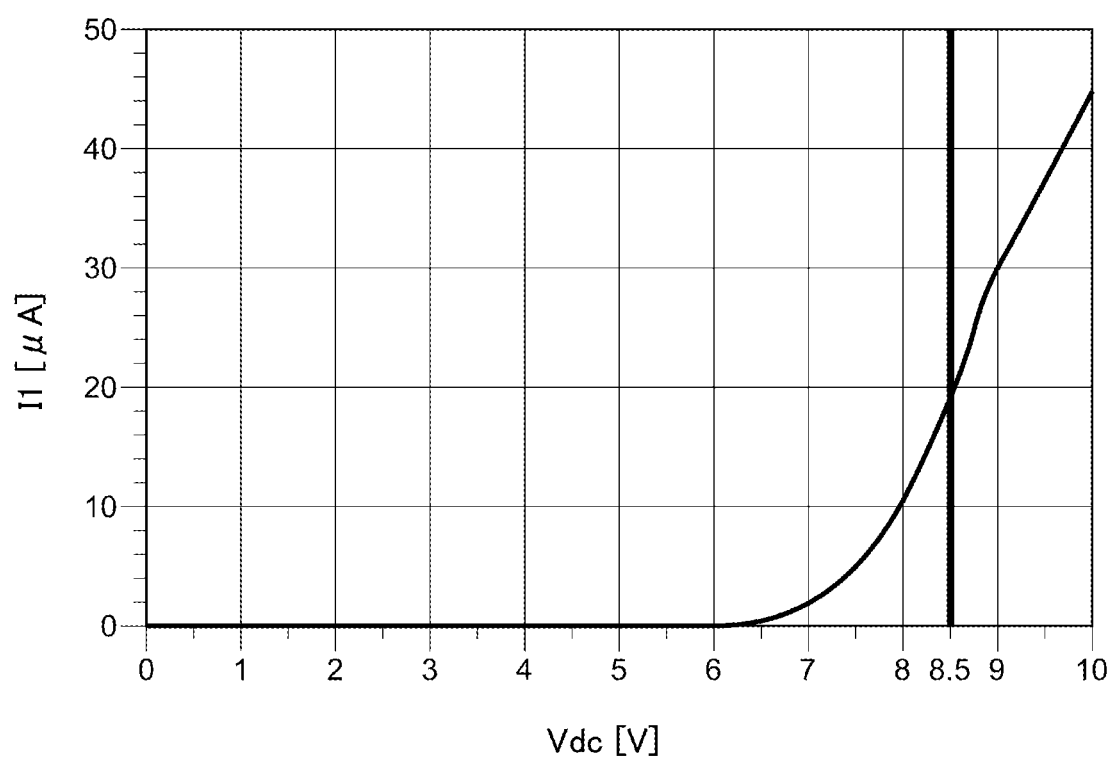
FIG. 4 is a graph illustrating a change in current in the clamp circuit.
Figure 5:
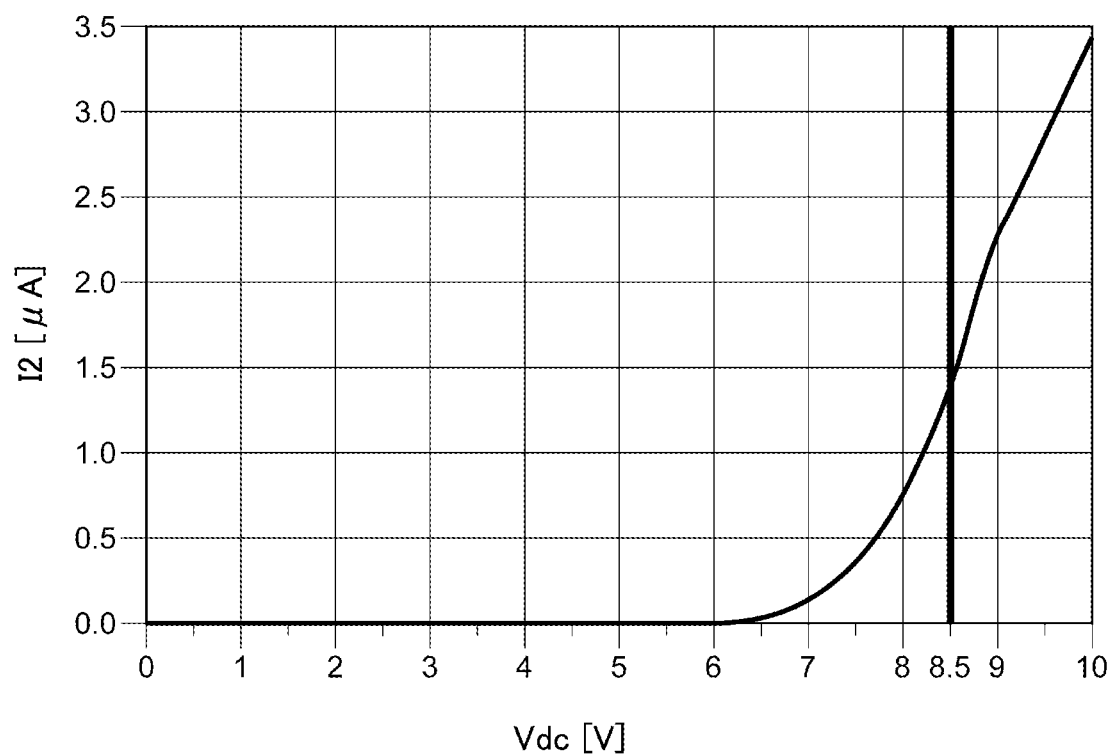
FIG. 5 is a graph illustrating a change in current in the clamp circuit.
Figure 6:
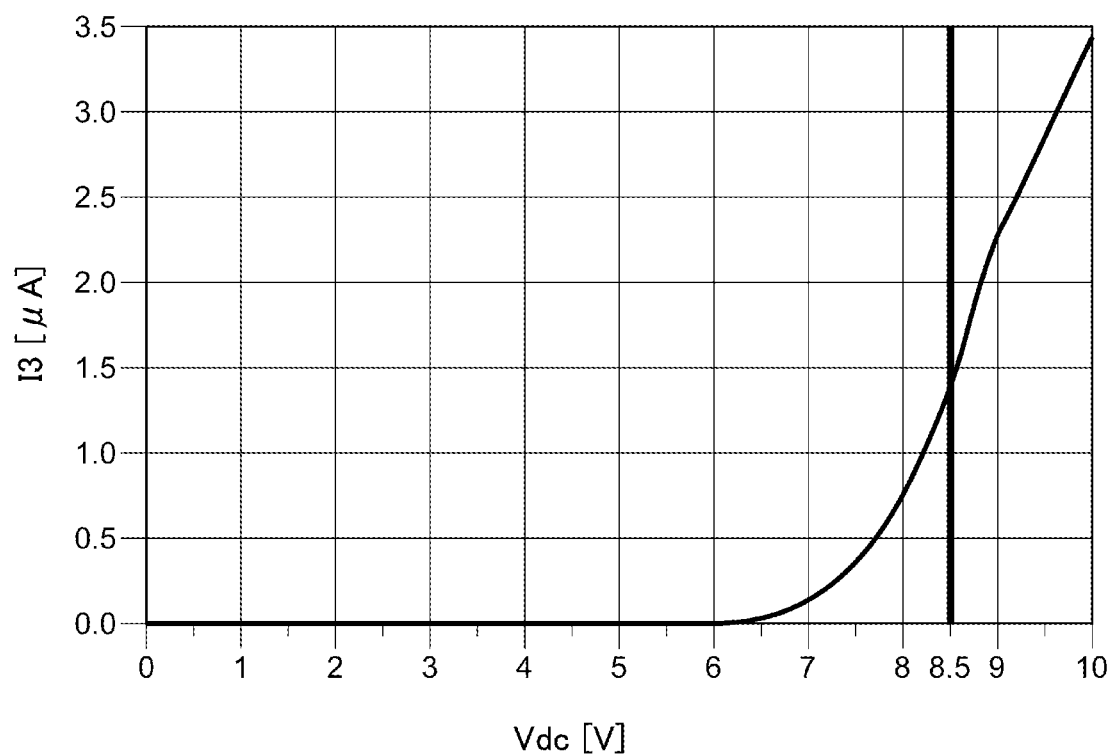
FIG. 6 is a graph illustrating a change in current in the clamp circuit.
Figure 7:
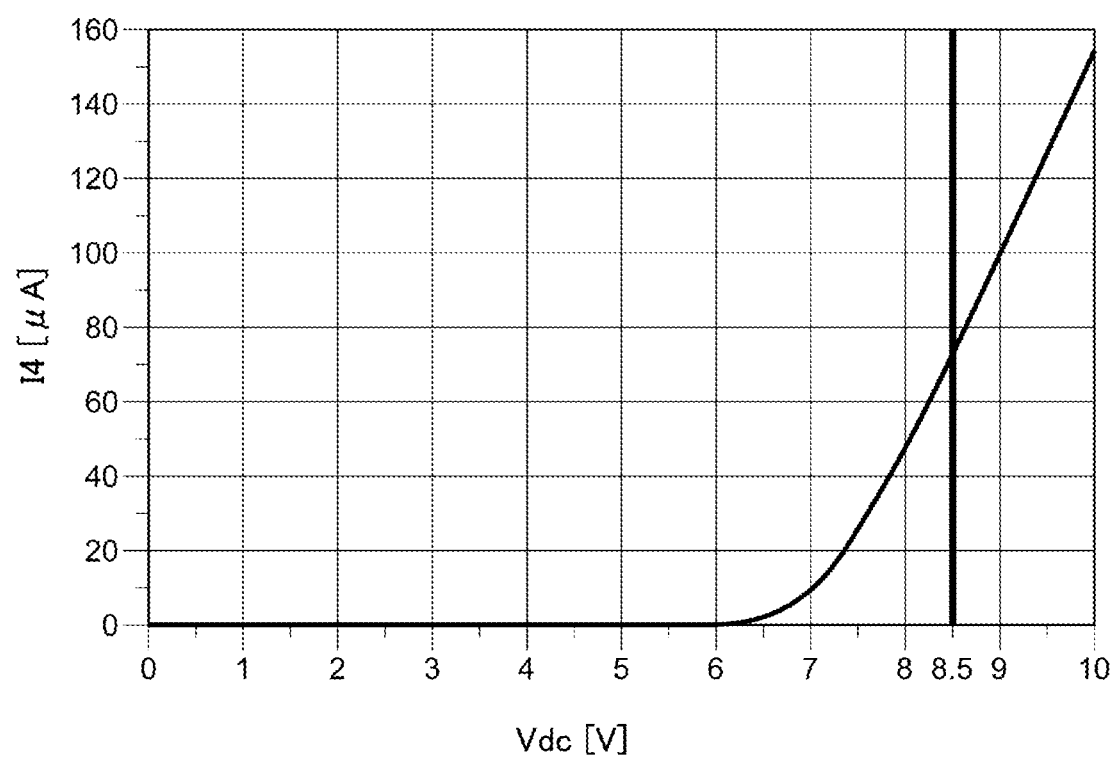
FIG. 7 is a graph illustrating a change in current in the clamp circuit.
Figure 8:
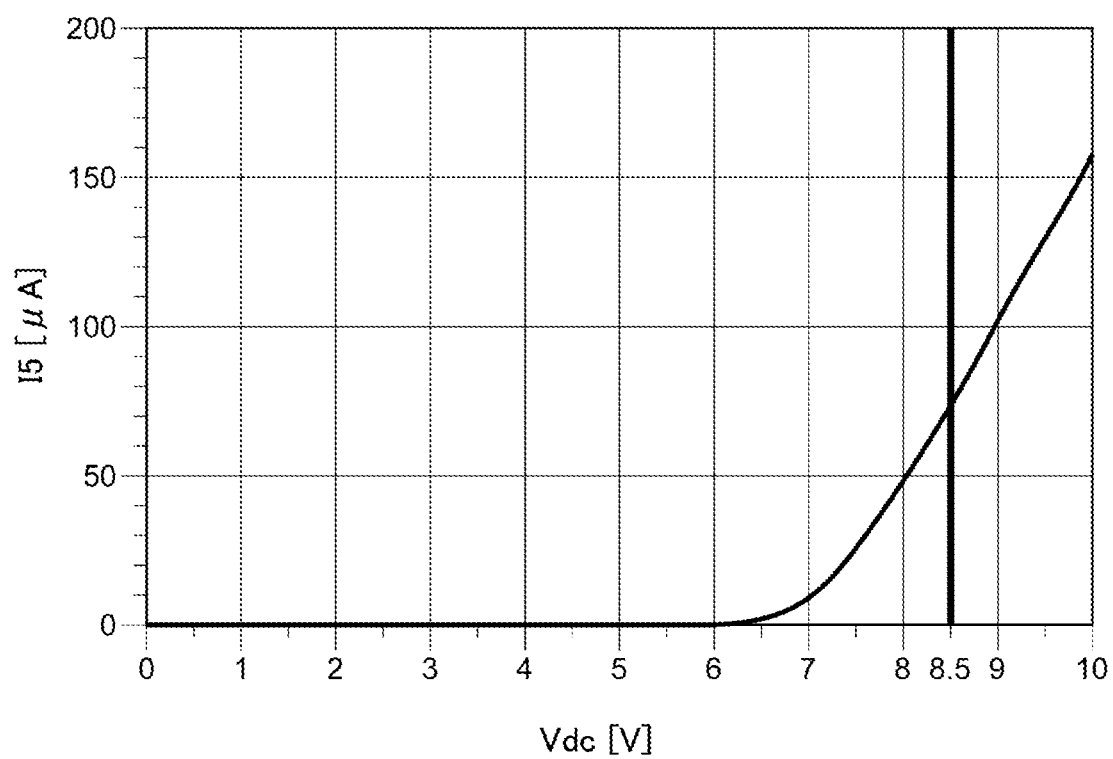
FIG. 8 is a graph illustrating a change in current in the clamp circuit.

FIG. 4 illustrates a change in a current I1 flowing through the diode section 301. FIG. 5 illustrates a base current I2 of the transistor 3021. The base current I2 is also an emitter current of the transistor 3022. FIG. 6 illustrates a collector current I3 of the transistor 3022. FIG. 7 illustrates a collector current I4 of the transistor 3021. FIG. 8 illustrates an emitter current I5 of the transistor 3021.

As illustrated in FIG. 4, when the DC voltage Vdc exceeds a threshold between 6 V and 7 V, the current I1 starts to flow through the diode section 301. When the current I1 flows, a base current flows through the transistor 3022, and accordingly the transistor 3022 is turned on.

When the transistor 3022 is turned on, as illustrated in FIG. 5, the base current I2 of the transistor 3021 flows from the emitter of the transistor 3022. When the transistor 3022 is turned on, as illustrated in FIG. 6, the collector current I3 of the transistor 3022 flows.

When the base current I2 flows through the transistor 3021, the transistor 3021 is turned on. When the transistor 3021 is turned on, as illustrated in FIG. 7, the collector current I4 flows. When the transistor 3021 is turned on, as illustrated in FIG. 8, the emitter current I5 flows.

Figure 9:
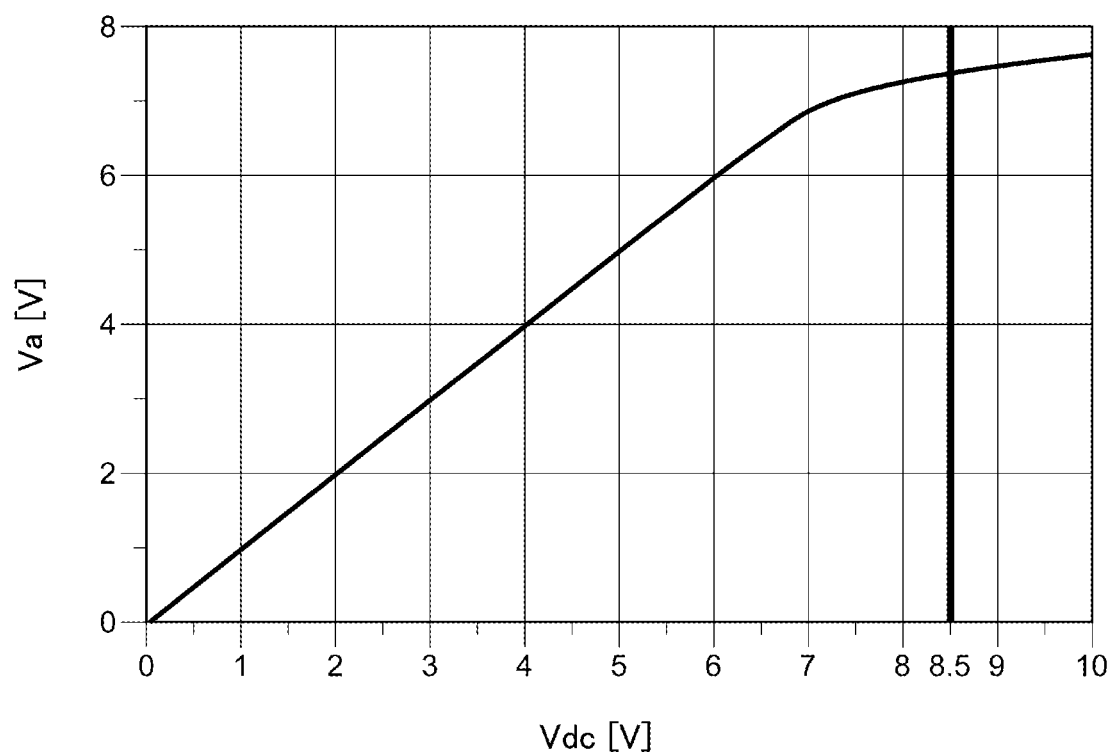
FIG. 9 is a graph illustrating a change in voltage across the clamp circuit.

FIG. 9 illustrates a change in a voltage Va across the node 303 and the node 304. The voltage Va corresponds to the amplitude of the voltage across the signal line 203. The voltage Va increases linearly before current flows through the clamp circuit 300, that is, when the DC voltage Vdc is smaller than the threshold. For a DC voltage larger than the DC voltage Vdc at which the clamp circuit 300 operates, current flows through the clamp circuit 300. Thus, the increase in the voltage Va is suppressed.

An example of the values of current illustrated in FIGS. 7 to 11 is provided. The DC voltage Vdc is assumed to be 8.5 V. At this time, the current I1 is 19.20 μA, the base current I2 is 1.443 mA, the collector current I3 is 1.424 mA, the collector current I4 is 73.34 mA, and the emitter current I5 is 74.78 mA.

The clamp circuit 300 operates so that the current I1, the base current I2, the collector current I3, the collector current I4, and the emitter current I5 are caused to flow. With the operation of the clamp circuit 300, the amount of current flowing from the resistance element R1 to the resistance element R2 is decreased.

The clamp circuit 300 causes the current I1 to flow through the diode section 301 in response to a voltage value exceeding the threshold, to decrease the amount of current flowing from the resistance element R1 to the resistance element R2.

In response to the transistor 3022 being turned on by the current I1, the clamp circuit 300 causes the collector current I3 to flow to further decrease the amount of current flowing from the resistance element R1 to the resistance element R2.

In response to the transistor 3021 being turned on by the base current I2, the clamp circuit 300 causes the collector current I4 and the emitter current I5 to flow. Accordingly, the amount of current flowing from the resistance element R1 to the resistance element R2 can be further decreased.

Figure 18:
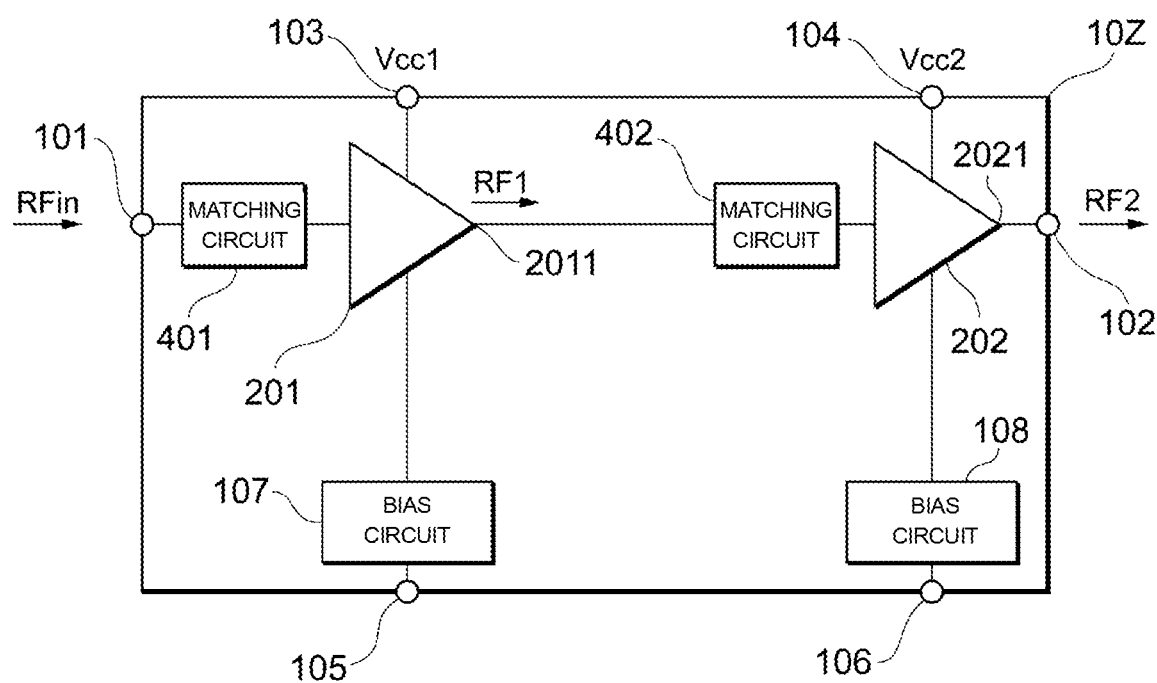
FIG. 18 is a block diagram of a power amplifier circuit according to a comparative example.
Figure 19:
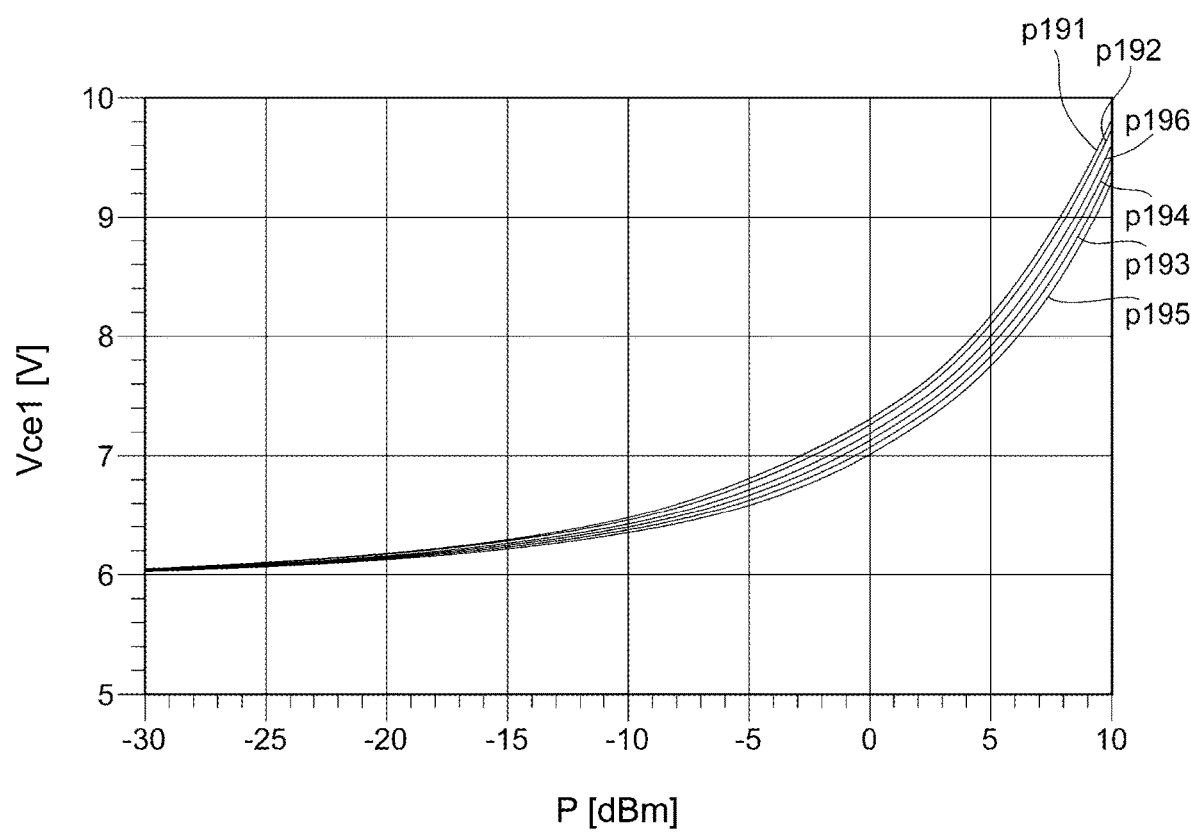
FIG. 19 is a graph illustrating voltage amplitudes of a preceding amplifier in the power amplifier circuit according to the comparative example.
Figure 20:
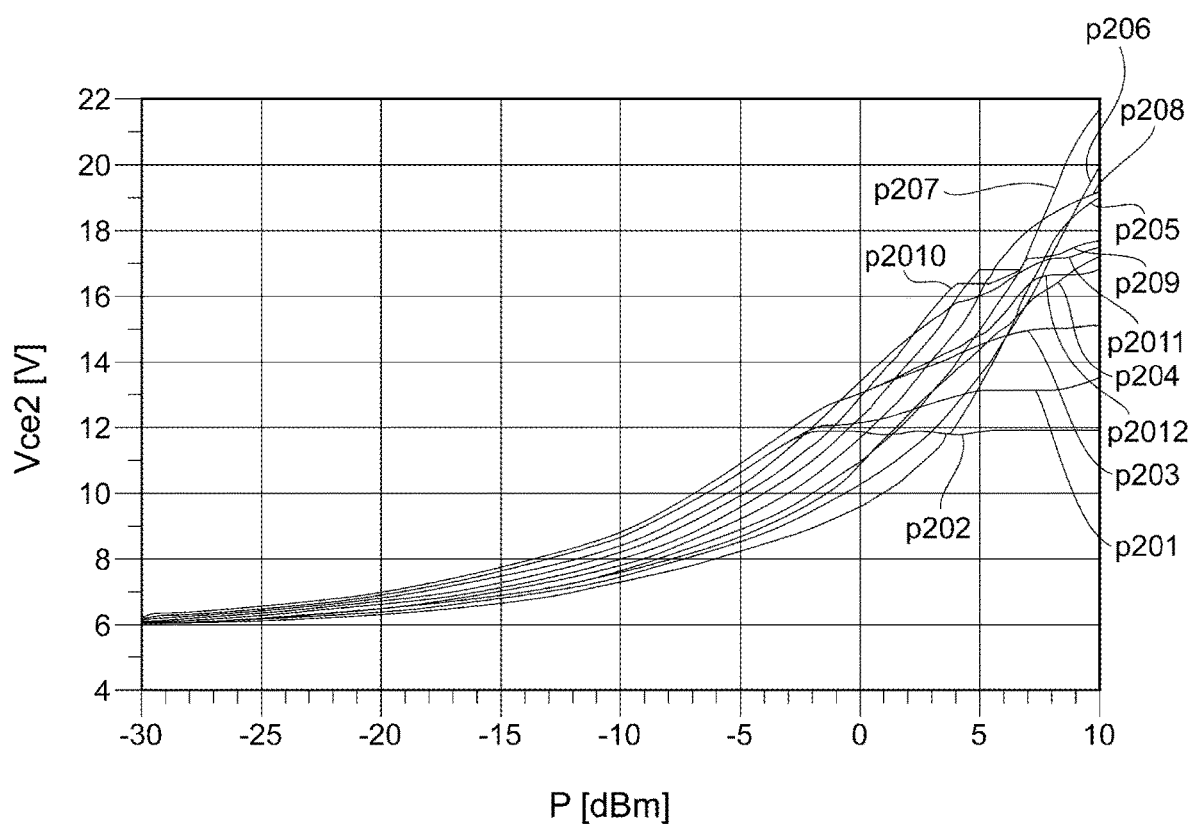
FIG. 20 is a graph illustrating voltage amplitudes of a subsequent amplifier in the power amplifier circuit according to the comparative example.

The protection function of the clamp circuit 300 will be described with reference to simulation results illustrated in FIGS. 10 and 11. A power amplifier circuit 10Z illustrated in FIG. 18 is used as a comparative example to the power amplifier circuit 10. FIGS. 19 and 20 are also referred to as a comparative example to FIGS. 10 and 11, respectively. The power amplifier circuit 10Z is different from the power amplifier circuit 10 in that the clamp circuit 300 is not included in the power amplifier circuit 10Z.

The simulation was conducted under conditions in which the voltage standing wave ratio (VSWR) was 8:1, the power supply voltage Vcc1 and the power supply voltage Vcc2 were 6.0 V, and the ambient temperature was 25° C. An alternating current signal was input as the input signal RFin, and the phase of the input signal RFin was changed from 0° to 360°. The measurement frequency was set to any value from 707 MHz to 915 MHz, as an example, to conduct the simulation.

Figure 10:
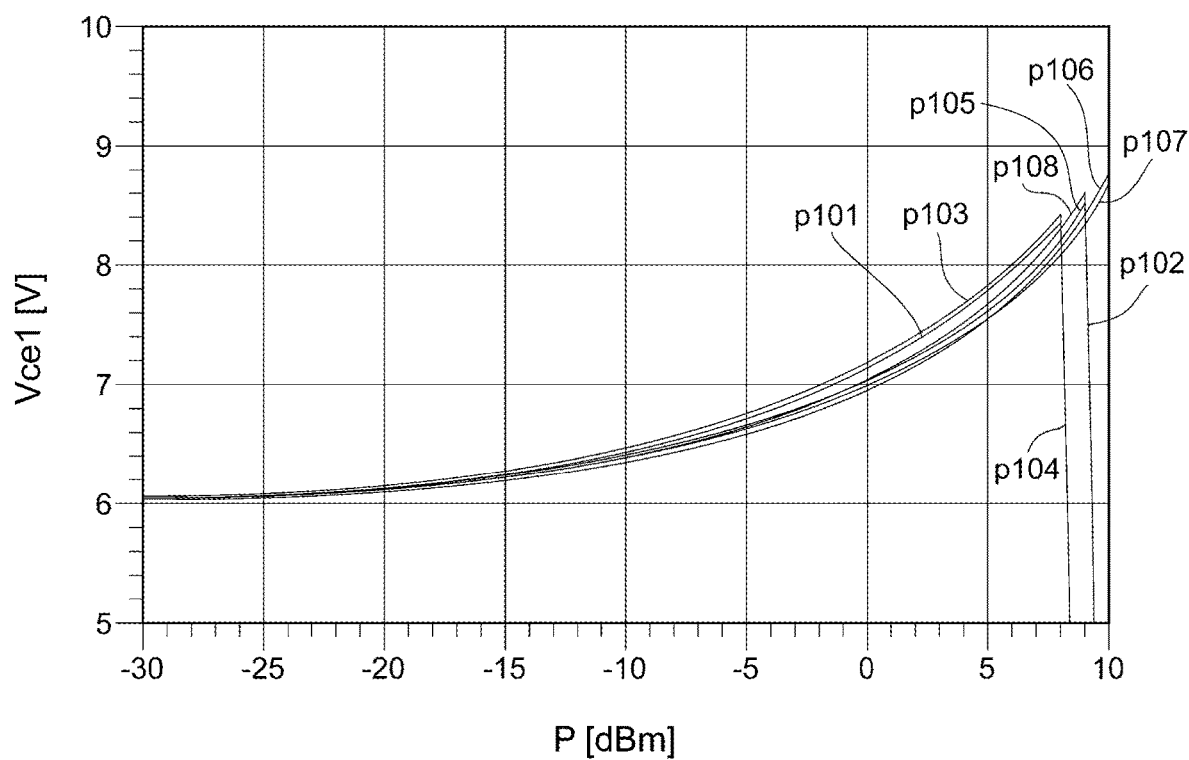
FIG. 10 is a graph illustrating voltage amplitudes of a preceding amplifier in the power amplifier circuit according to the embodiment.

FIG. 10 is a graph illustrating a change in a voltage amplitude Vce1 at the output terminal 2011 of the amplifier 201 in the power amplifier circuit 10 when output power P of the power amplifier circuit 10 is changed. In FIG. 10, the phase corresponding to curved lines p101 to p108 is 0° for the curved line p101, 30° for the curved line p102, 60° for the curved line p103, 90° for the curved line p104, 120° for the curved line p105, 150° for the curved line p106, 180° for the curved line p107, and 330° for the curved line p108.

FIG. 19 is a similar graph illustrating the relationship between the output power P of the power amplifier circuit 10Z and the voltage amplitude Vce1 in the power amplifier circuit 10Z. In FIG. 19, the phase corresponding to curved lines p191 to p196 is 60° for the curved line p191, 90° for the curved line p192, 150° for the curved line p193, 180° for the curved line p194, 240° for the curved line p195, and 330° for the curved line p196.

In FIGS. 10 and 19, the voltage amplitude Vce1 increases with an increase in the output power P. In FIG. 10, the voltage amplitude Vce1 increases up to about 8.5 V, regardless of the phase. In FIG. 19, in contrast, the voltage amplitude Vce1 increases beyond 8.5 V.

In the power amplifier circuit 10, the clamp circuit 300, which operates in responses to the voltage amplitude Vce1 exceeding a certain threshold, decreases the amount of current flowing from the amplifier 201 to the amplifier 202. Thus, the voltage amplitude Vce1 does not continuously increase with an increase in the output power P.

Figure 11:
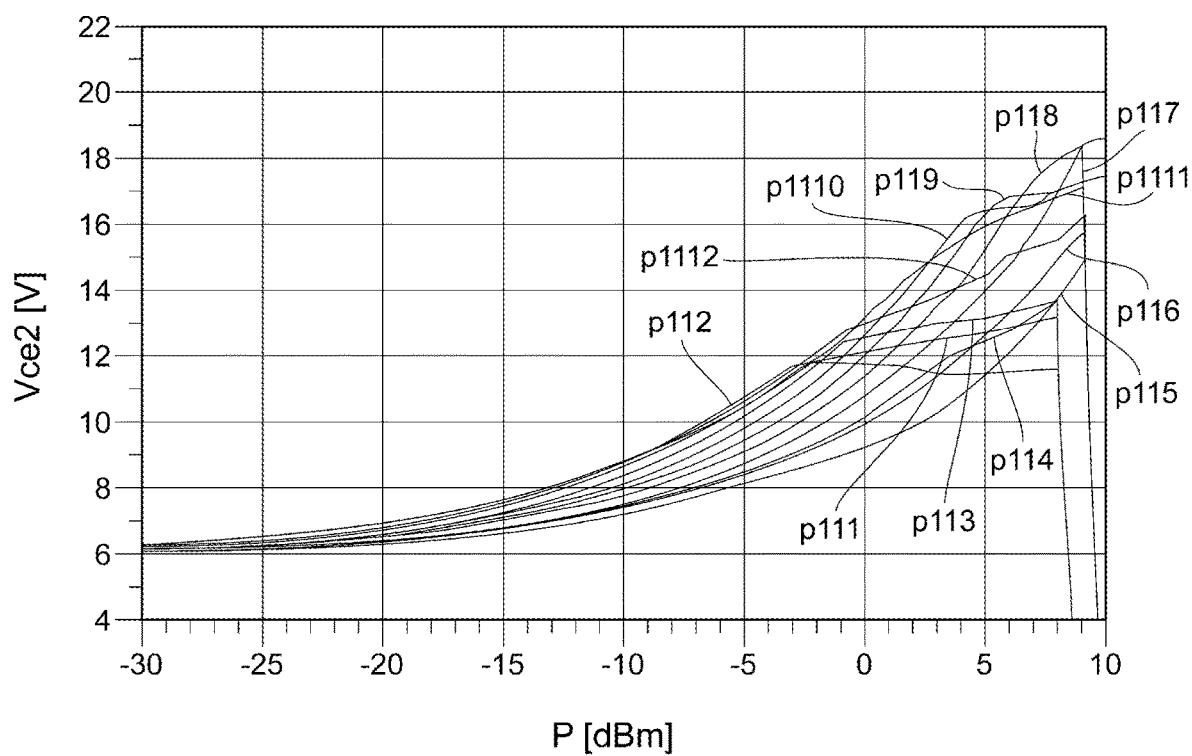
FIG. 11 is a graph illustrating voltage amplitudes of a subsequent amplifier in the power amplifier circuit according to the embodiment.

FIG. 11 is a graph illustrating a change in a voltage amplitude Vce2 at the output terminal 2021 of the amplifier 202 in the power amplifier circuit 10 when the output power P of the amplifier 201 is changed. In FIG. 11, the phase corresponding to curved lines p111 to p1112 is increased in increments of 30° from 0° corresponding to the curved line p111 to 330° corresponding to the curved line p1112.

FIG. 20 is a similar graph illustrating the relationship between the output power P of the power amplifier circuit 10Z and the voltage amplitude Vce2 in the power amplifier circuit 10Z. In FIG. 20, the phase corresponding to curved lines p201 to p2012 is increased in increments of 30° from 0° corresponding to the curved line p201 to 330° corresponding to the curved line p2012.

In FIG. 11, when the output power P is increased, the voltage amplitude Vce2 changes within a range whose upper limit is about 18 V. In FIG. 20, in contrast, the voltage amplitude Vce2 increases beyond 18 V.

In FIG. 11, the increase in the voltage amplitude Vce2 is suppressed because of the clamp circuit 300. Specifically, the clamp circuit 300 suppresses an increase in the voltage amplitude Vce1. Since the increase in the voltage amplitude Vce1 is suppressed, the amplitude of the amplified signal RF1 to be amplified by the amplifier 202 is suppressed. Since the amplitude of the amplified signal RF1 is suppressed, the increase in the voltage amplitude Vce2 is suppressed.

Suppressing the increase in the voltage amplitude Vce2 can suppress destruction of the amplifier 202 caused by an excessive voltage.

The threshold at which the clamp circuit 300 operates depends on the number of stages of diodes in the diode section 301 and the number of stages of transistors in the transistor section 302. The number of stages of diodes and the number of stages of transistors can be changed as appropriate in consideration of the threshold at which the clamp circuit 300 operates.

Figure 12:
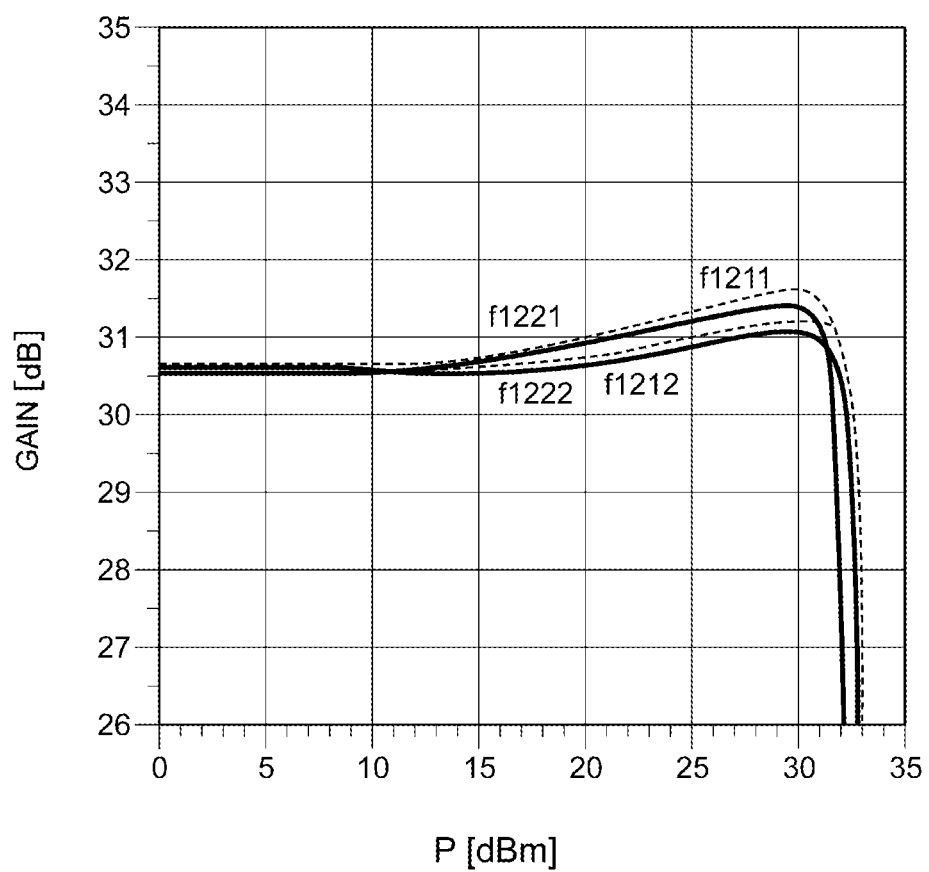
FIG. 12 is a graph illustrating an example of gains of the power amplifier circuit according to the embodiment.

The characteristics of the power amplifier circuit 10 differ when the diode section 301 includes five stages of diodes and when the diode section 301 includes six stages of diodes. FIG. 12 illustrates the respective gains of the power amplifier circuit 10 for the output power P of the power amplifier circuit 10 when the frequency of the input signal RFin is 782 MHz and 897.5 MHz.

In FIG. 12, the gains obtained when the diode section 301 includes five stages of diodes are indicated by solid lines f1211 and f1212. The gains obtained when the diode section 301 includes six stages of diodes are indicated by dashed lines f1221 and f1222. The solid line f1211 and the dashed line f1221 indicate results for a frequency of 782 MHz. The solid line f1212 and the dashed line f1222 indicate results for a frequency of 897.5 MHz.

Figure 13:
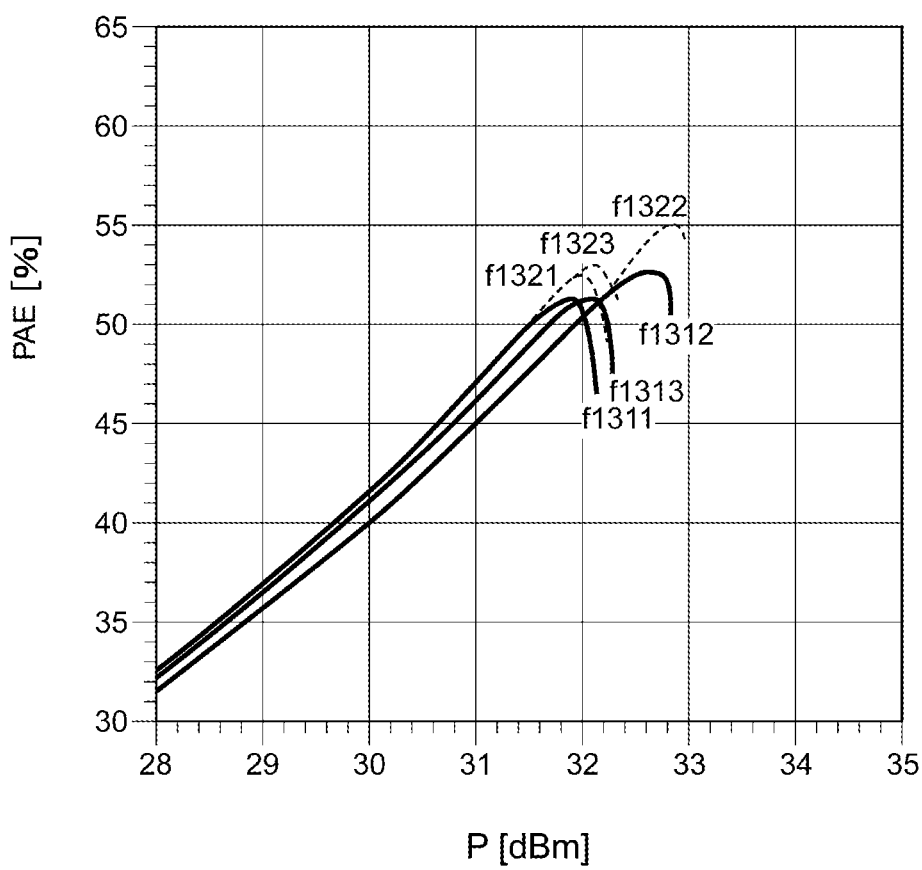
FIG. 13 is a graph illustrating an example of power-added efficiencies of the power amplifier circuit according to the embodiment.

FIG. 13 illustrates power-added efficiencies (PAEs) of the power amplifier circuit 10 for the output power P of the power amplifier circuit 10 when the frequency of the input signal RFin is 782 MHz, 897.5 MHz, and 831.5 MHz.

In FIG. 13, the PAEs obtained when the diode section 301 includes five stages of diodes are indicated by solid lines f1311, f1312, and f1313. The PAEs obtained when the diode section 301 includes six stages of diodes are indicated by dashed lines f1321, f1322, and f1323. The solid line f1311 and the dashed line f1321 indicate results for a frequency of 782 MHz. The solid line f1312 and the dashed line f1322 indicate results for a frequency of 897.5 MHz. The solid line f1313 and the dashed line f1323 indicate results for a frequency of 831.5 MHz.

As illustrated in FIG. 12, when the diode section 301 includes five stages of diodes, the power amplifier circuit 10 exhibits higher linearity than when the diode section 301 includes six stages of diodes. In contrast, as illustrated in FIG. 13, when the diode section 301 includes five stages of diodes, the power amplifier circuit 10 provides lower PAE than when the diode section 301 includes six stages of diodes.

The reason for the reduction in PAE is that the threshold at which the clamp circuit 300 operates when the diode section 301 includes five stages of diodes is smaller than that when the diode section 301 includes six stages of diodes. Since the clamp circuit 300 operates with smaller voltage amplitude, the amount of current flowing through the clamp circuit 300 is larger than that when the diode section 301 includes six stages of diodes. The clamp circuit 300 consumes a larger amount of current, resulting in a reduction in efficiency.

The characteristics of the power amplifier circuit 10 differ depending on the number of stages of diodes in the diode section 301. It is therefore possible to adjust the characteristics of a circuit by changing the number of stages of diodes.

Figure 14:
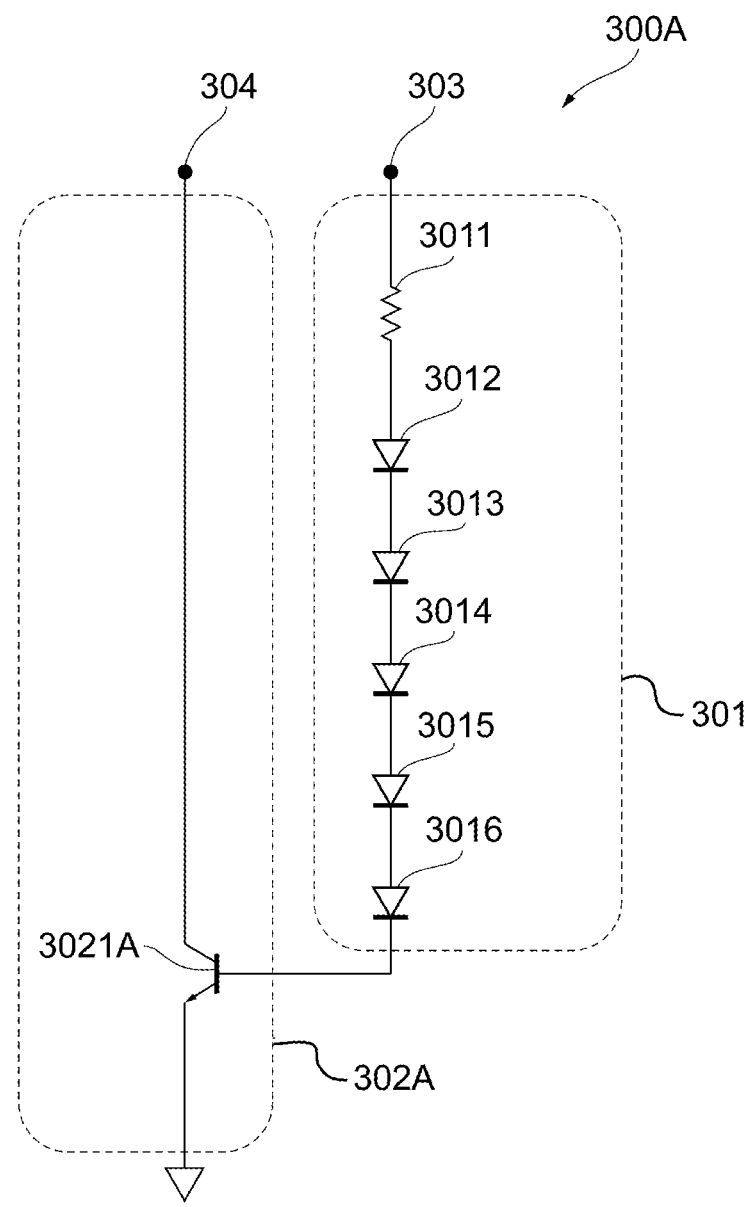
FIG. 14 is a circuit diagram of a modification of the clamp circuit.

The characteristics of the power amplifier circuit 10 also differ depending on the number of stages of transistors in the transistor section 302. For example, in a modification illustrated in FIG. 14, a transistor section 302A in a clamp circuit 300A may include one stage of transistor 3021A. Alternatively, a transistor section including two or more stages of transistors may be used.

Figure 15:
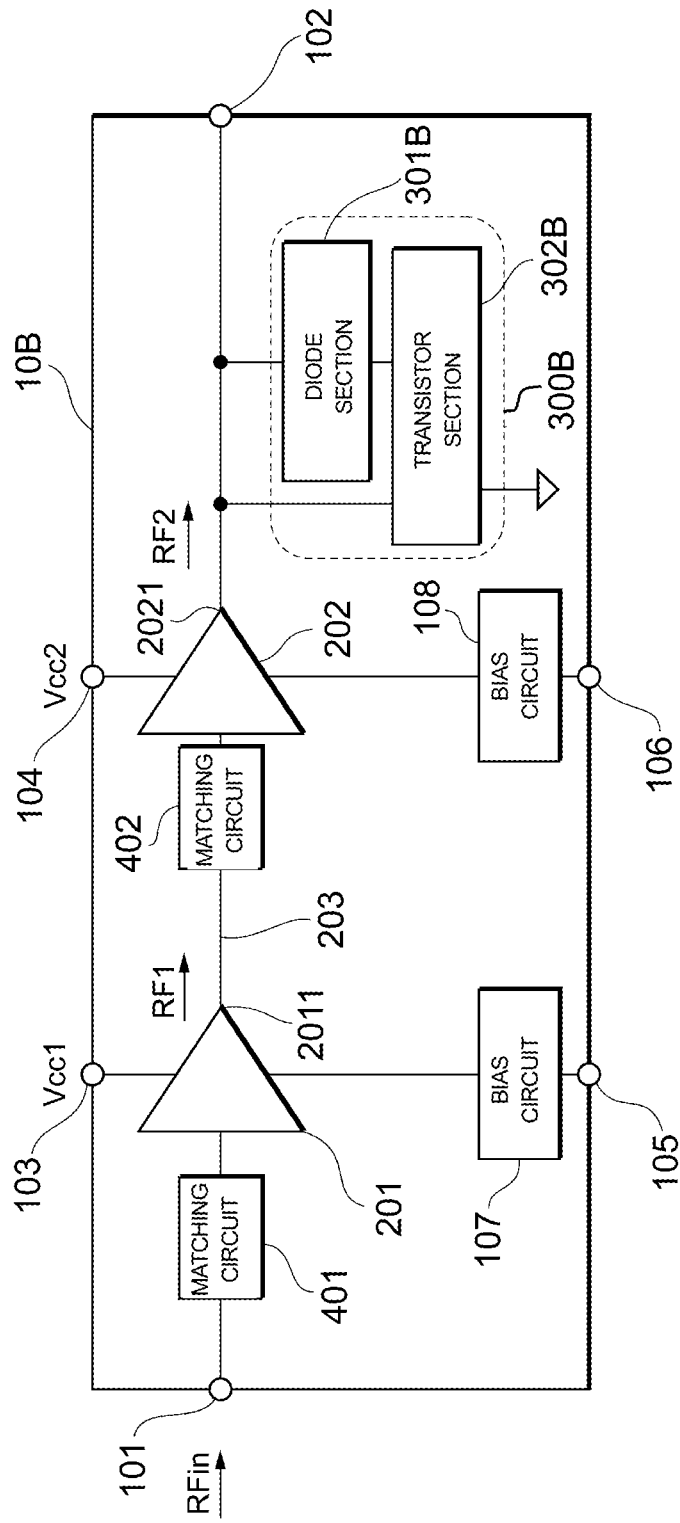
FIG. 15 is a block diagram of a power amplifier circuit according to a reference example.

In the power amplifier circuit 10, the clamp circuit 300 can suppress destruction of the amplifier 202 caused by an excessive voltage. The clamp circuit 300 may be used as in a power amplifier circuit 10B according to a reference example illustrated in FIG. 15.

In the power amplifier circuit 10B, unlike the power amplifier circuit 10, a clamp circuit 300B is disposed between ground and a signal line extending between the amplifier 202 and the terminal 102. A circuit configuration of a diode section 301B and a transistor section 302B is substantially the same as that in the power amplifier circuit 10 illustrated in FIG. 2.

Figure 16:
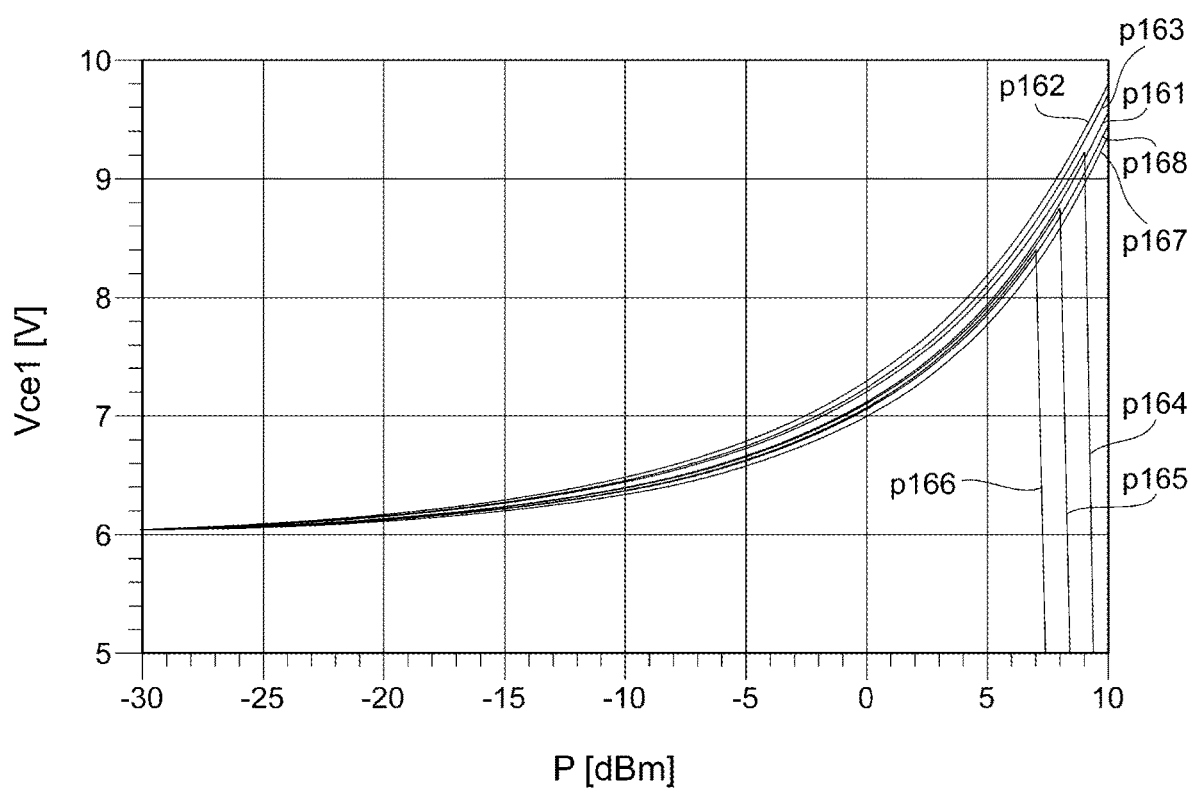
FIG. 16 is a graph illustrating voltage amplitudes of a preceding amplifier in the power amplifier circuit according to the reference example.
Figure 17:
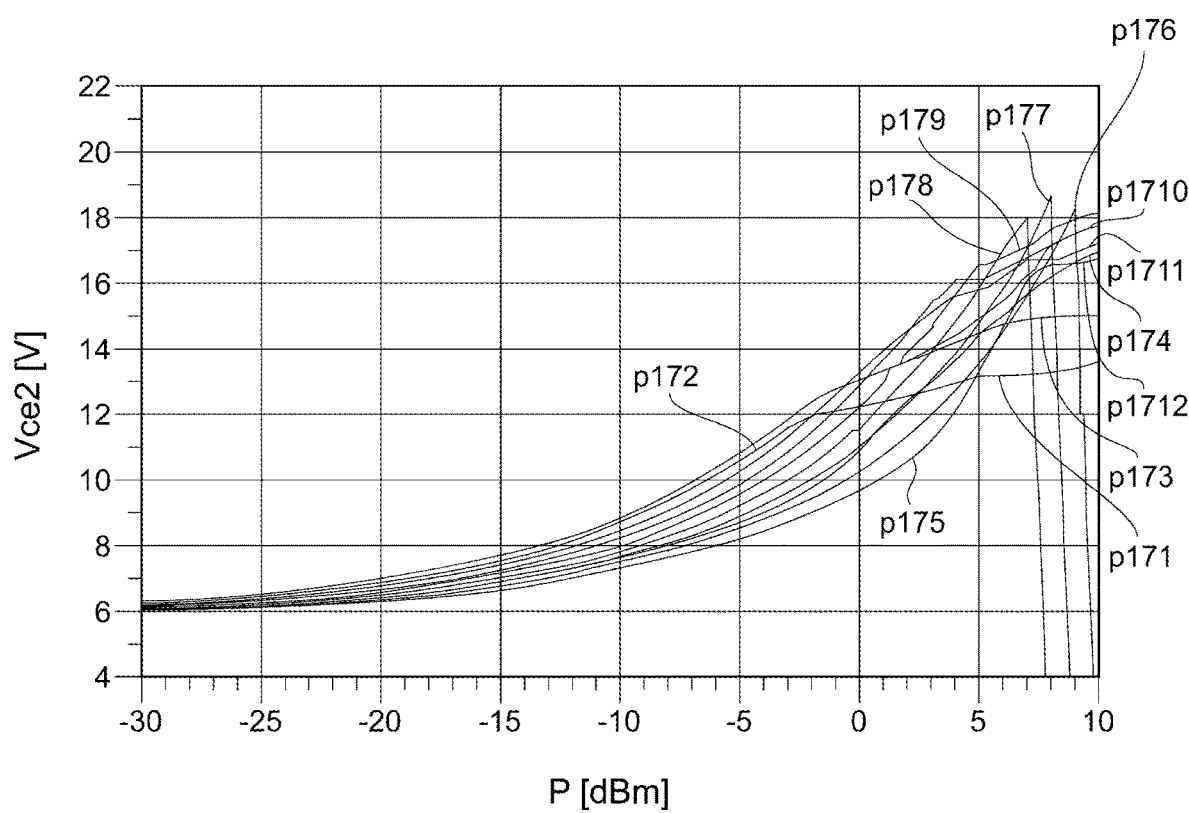
FIG. 17 is a graph illustrating voltage amplitudes of a subsequent amplifier in the power amplifier circuit according to the reference example.

FIGS. 16 and 17 illustrate results of a simulation conducted under conditions similar to those in FIGS. 10 and 11. In FIG. 16, the phase corresponding to curved lines p161 to p168 is 30° for the curved line p161, 60° for the curved line p162, 90° for the curved line p163, 150° for the curved line p164, 180° for the curved line p165, 210° for the curved line p166, 240° for the curved line p167, and 300° for the curved line p168.

In FIG. 16, the voltage amplitude Vce1 continuously increases with an increase in the output power P. This is because, in the power amplifier circuit 10B, unlike the power amplifier circuit 10, the amount of current between the amplifier 201 and the amplifier 202 does not decrease.

In FIG. 17, the phase corresponding to curved lines p171 to p1712 is increased in increments of 30° from 0° corresponding to the curved line p171 to 330° corresponding to the curved line p1712.

In FIG. 17, when the output power P increases, the increase in the voltage amplitude Vce2 is suppressed so that an upper limit of about 18 V is not exceeded. This is because, like the operation of the clamp circuit 300 in the power amplifier circuit 10 to suppress the voltage amplitude Vce1, the clamp circuit 300B operates at a certain threshold and suppresses the voltage amplitude Vce2.

The power amplifier circuit 10B can also suppress the increase in the voltage amplitude Vce2 with an increase in the output power P. The power amplifier circuit 10B can therefore suppress destruction of the amplifier 202 caused by an excessive voltage.

An exemplary embodiment of the present disclosure has been described. The power amplifier circuit 10 according to this embodiment includes the amplifier 201 that amplifies the input signal RFin and outputs the amplified signal RF1, the amplifier 202 that is disposed subsequent to the amplifier 201 and that amplifies the amplified signal RF1 and outputs the amplified signal RF2, and the clamp circuit 300 that is disposed between ground and the signal line 203 extending between the amplifier 201 and the amplifier 202 and that suppresses an amplitude of the amplified signal RF1.

Since the clamp circuit 300 suppresses the amplitude of the amplified signal RF1, which is also a signal input to the amplifier 202, the amplitude of the amplified signal RF2 is suppressed. If the amplitude of the amplified signal RF2 is considered in terms of the voltage amplitude Vce2, suppressing the voltage amplitude Vce2 can suppress destruction of the amplifier 202 caused by an excessive voltage.

In the power amplifier circuit 10, the clamp circuit 300 includes the diode section 301 including the diode 3012 having an anode connected to the signal line 203 side and a cathode connected to the ground side, and the transistor section 302 including the transistor 3021 having a base, a collector connected to the signal line 203, and an emitter connected to ground, wherein a signal is input to the base of the transistor 3021 via the diode section 301.

In this configuration, the diode 3012 can detect fluctuations in the voltage of the amplified signal RF1. In response to detection of fluctuations in the voltage of the amplified signal RF1, current flows through the diode 3012. In response to the current flowing through the diode 3012, the transistor 3021 is turned on. When the transistor 3021 is turned on, current flows through the transistor 3021. The amount of current flowing between the amplifier 201 and the amplifier 202 is decreased. Therefore, the amplitude of the amplified signal RF1 is suppressed.

In the power amplifier circuit 10, furthermore, the diode section 301 includes the plurality of diodes 3012, 3013, 3014, 3015, and 3016 connected in series with each other. With this configuration, the threshold at which the clamp circuit 300 operates can be adjusted.

In the power amplifier circuit 10, furthermore, the diode section 301 further includes the resistance element 3011 connected in series with the diode 3012. With this configuration, the amount of current flowing through the diode section 301 can be adjusted.

In the power amplifier circuit 10, furthermore, the transistor section 302 further includes the transistor 3022 having a base connected in series with the diode section 301, a collector connected to the collector of the transistor 3021, and an emitter connected to the base of the transistor 3021.

With this configuration, the clamp circuit 300 allows a larger amount of current to be provided to the clamp circuit 300. In addition, the transistor 3021 and the transistor 3022 can adjust the threshold at which the clamp circuit 300 operates.

The embodiment described above is intended to facilitate understanding of the present disclosure and should not be used to construe the present disclosure in a limiting fashion. The present disclosure may be modified or improved without necessarily departing from the gist thereof, and the present disclosure also includes its equivalents. That is, the embodiment may be appropriately modified in design by those skilled in the art, and such modifications also fall within the scope of the present disclosure so long as the modifications include the features of the present disclosure. For example, the elements included in the embodiment described above and the arrangement, materials, conditions, shapes, sizes, and so on thereof are not limited to those illustrated exemplarily but can be modified as appropriate.

In addition, it is to be understood that the embodiment described above is for illustrative purposes and that partial substitutions or combinations of elements illustrated in different embodiments can be made. Such substitutions or combinations also fall within the scope of the present disclosure so long as the substitutions or combinations include the features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    a first amplifier configured to amplify an input signal and to output a first amplified signal;
    a second amplifier that is subsequent to the first amplifier along a signal line, and that is configured to amplify the first amplified signal and to output a second amplified signal; and
    a clamp circuit that is between ground and the signal line, and that is configured to suppress an amplitude of the first amplified signal and to operate in response to a voltage of the amplitude of the first amplified signal exceeding a threshold value.

2. The power amplifier circuit according to claim 1, wherein the clamp circuit comprises:
    a diode section connected between the signal line and ground and comprising a first diode having an anode connected to a signal line side of the diode section, and a cathode connected to a ground side of the diode section, and
    a transistor section comprising a first transistor having a base, a collector connected to the signal line, and an emitter connected to ground, wherein a signal is input to the base of the first transistor via the diode section.

3. The power amplifier circuit according to claim 2, wherein the diode section comprises a plurality of diodes connected in series with each other, the plurality of diodes including the first diode.

4. The power amplifier circuit according to claim 2, wherein the diode section further comprises a resistance element connected in series with the first diode.

5. The power amplifier circuit according to claim 3, wherein the diode section further comprises a resistance element connected in series with the first diode.

6. The power amplifier circuit according to claim 4, wherein the resistance element is connected between the signal line and the first diode.

7. The power amplifier circuit according to claim 5, wherein the resistance element is connected between the signal line and the first diode.

8. The power amplifier circuit according to claim 2, wherein the transistor section further comprises:
    a second transistor having a base connected in series with the diode section, a collector connected to the collector of the first transistor, and an emitter connected to the base of the first transistor.

9. The power amplifier circuit according to claim 3, wherein the transistor section further comprises:
    a second transistor having a base connected in series with the diode section, a collector connected to the collector of the first transistor, and an emitter connected to the base of the first transistor.

10. The power amplifier circuit according to claim 4, wherein the transistor section further comprises:
    a second transistor having a base connected in series with the diode section, a collector connected to the collector of the first transistor, and an emitter connected to the base of the first transistor.

11. The power amplifier circuit according to claim 2, wherein the transistor section further comprises:
    a second transistor;
    wherein the first transistor and the second transistor are Darlington-connected.

12. The power amplifier circuit according to claim 3, wherein the transistor section further comprises:
    a second transistor;
    wherein the first transistor and the second transistor are Darlington-connected.

13. The power amplifier circuit according to claim 4, wherein the transistor section further comprises:
    a second transistor;
    wherein the first transistor and the second transistor are Darlington-connected.

* * * * *